(12) United States Patent
Nagata

(10) Patent No.: US 7,354,629 B2
(45) Date of Patent: Apr. 8, 2008

(54) METHOD OF FORMING A PROTECTIVE FILM AND A MAGNETIC RECORDING MEDIUM HAVING A PROTECTIVE FILM FORMED BY THE METHOD

(75) Inventor: Naruhisa Nagata, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/463,781

(22) Filed: Aug. 10, 2006

(65) Prior Publication Data

US 2007/0037014 A1 Feb. 15, 2007

(30) Foreign Application Priority Data

Aug. 10, 2005 (JP) ............................. 2005-232364

(51) Int. Cl.
*C23C 14/12* (2006.01)

(52) U.S. Cl. ...................... 427/525; 427/488; 427/489; 427/490; 427/491

(58) Field of Classification Search .................... 429/6; 427/523, 525, 530, 577, 562
See application file for complete search history.

(56) References Cited

U.S. PATENT DOCUMENTS

| | | | |
|---|---|---|---|
| 4,996,079 A | | 2/1991 | Itoh |
| 5,981,000 A | | 11/1999 | Grill et al. |
| 6,066,399 A | * | 5/2000 | Hirano et al. ................. 428/408 |
| 6,354,008 B1 | * | 3/2002 | Domoto et al. ........... 30/346.53 |
| 6,391,419 B1 | * | 5/2002 | Katayama et al. ........ 428/833.2 |
| 6,455,101 B1 | * | 9/2002 | Sasaki et al. ................. 427/130 |
| 6,468,602 B2 | * | 10/2002 | Sakaguchi et al. ........... 427/570 |
| 6,528,115 B1 | * | 3/2003 | Hirano et al. ............. 427/249.1 |
| 6,571,729 B2 | * | 6/2003 | Sasaki et al. ............. 118/723 R |
| 2002/0011212 A1 | * | 1/2002 | Ogawa et al. ............... 118/718 |
| 2002/0028286 A1 | * | 3/2002 | Sasaki et al. ................ 427/131 |
| 2002/0064606 A1 | * | 5/2002 | Sakaguchi et al. ........... 427/569 |

FOREIGN PATENT DOCUMENTS

| | | |
|---|---|---|
| JP | 09-128732 A | 5/1997 |
| JP | 2000-268357 A | 9/2000 |
| JP | 2004-288327 A | 10/2004 |
| JP | 2005-158092 A | 6/2005 |
| WO | 99014746 | 3/1999 |

OTHER PUBLICATIONS

Search Report issued in corresponding Singapore (Australia) patent application No. 2006-04694-0, dated Aug. 29, 2007.

* cited by examiner

*Primary Examiner*—Carol Chaney
*Assistant Examiner*—Gary D. Harris

(57) ABSTRACT

A method of forming a protective film that restrains gas adsorption while preserving durability and corrosion resistance of a plasma CVD carbon film is disclosed. A protective film of a slide-resistant member is deposited by means of a plasma CVD method using a raw material of hydrocarbon gas, wherein a bias voltage higher than −500 V is applied to the slide-resistant member in an initial stage of depositing the protective film, and a bias voltage of −500 V or lower is applied in a final stage of deposition. A proportion of time duration of the final stage is preferably at most 25% of the total time for depositing the protective film. A magnetic recording medium comprising a magnetic recording layer and a protective film formed by the method also is disclosed.

3 Claims, 2 Drawing Sheets

METHOD OF FORMING A PROTECTIVE FILM AND A MAGNETIC RECORDING MEDIUM HAVING A PROTECTIVE FILM FORMED BY THE METHOD

CROSS REFERENCE TO RELATED APPLICATIONS

This application is based on, and claims priority to, Japanese Patent Application No. 2005-232364, filed on Aug. 10, 2005, the contents of which are incorporated herein by reference.

BACKGROUND OF THE INVENTION

A. Field of the Invention

The present invention relates to a method of forming a protective film of a slide-resistant member or a wear-resistant member, and to a slide-resistant member having a protective film formed by the method. In particular, the present invention relates to a method of forming a protective film of a magnetic recording medium, and to a magnetic recording medium having a protective film formed by the method.

B. Description of the Related Art

A protective film of mainly carbon is used as a hard coating film that constitutes a surface portion of a slide-resistant member or a wear-resistant member. In the field of magnetic recording, for example, slide-resistance or wear-resistance is necessary because of contact between a magnetic recording medium and a magnetic head. For a protective film of a magnetic recording medium or a magnetic head, a film mainly composed of carbon (hereinafter referred to as "a carbon film") is used.

A carbon protective film is composed of diamond-like carbon (DLC), tetrahedral amorphous carbon (ta-C), amorphous carbon (a-C) or the like. Among them, a DLC film is suited for a surface coating film owing to smoothness and high hardness of its surface. Known methods of forming a carbon film include sputtering, plasma CVD, and so on.

A carbon film formed by a plasma CVD method (hereinafter referred to as "p-CVD carbon film") is denser and harder as compared with a carbon film formed by a sputtering method, and so, superior in durability and corrosion resistance. The p-CVD carbon film, being formed from hydrocarbon radicals, tends to have a rigid three-dimensional tetrahedral structure through the hydrogen, which brings about the superiority. For this reason, a protective film in a magnetic recording medium today is composed of a p-CVD carbon film, in particular, a DLC film. Although a p-CVD carbon film is beneficial in durability and corrosion resistance, the p-CVD carbon film is unfavorable for restraining gas adsorption on the surface of the protective film, because hydrogen existing on the surface of the p-CVD carbon film can be an adsorption site for gas such as $SO_2$. To restrain gas adsorption on a surface of protective film, studies have been done including a method disclosed in Japanese Patent Unexamined Publication No. Hei9-128732, in which a carbon film deposited by sputtering is laminated on a p-CVD carbon film, and a method disclosed in Japanese Patent Unexamined Publication No. 2004-288327, in which the surface of a p-CVD carbon film is subjected to plasma treatment under an atmosphere of mixed gas of rare gas and oxygen.

However, the method in which a carbon film deposited by sputtering is laminated on a p-CVD carbon film involves a problem of increased thickness of the protective film. This is undesirable because, in a magnetic recording medium, for example, the thick protective film increases a magnetic spacing that is the spacing between a magnetic recording layer of the magnetic recording medium and a read/write element of a magnetic head, and this degrades read/write performance. It is another problem to require an additional manufacturing step of the plasma treatment after deposition of a p-CVD carbon film.

The present invention is directed to overcoming or at least reducing the effects of one or more of the problems set forth above.

SUMMARY OF THE INVENTION

In light of the above-described problems, an object of the present invention is to provide a method of forming a protective film that restrains gas adsorption while preserving durability and corrosion resistance of a p-CVD carbon film. Another object of the invention is to provide a magnetic recording medium that has a protective film formed by such a method, to prevent any increase of magnetic spacing so that the medium exhibits satisfactory read/write performance.

To achieve these and other objects, a method of the invention deposits a protective film of a slide-resistant member by means of a plasma CVD method using a raw material of hydrocarbon gas, wherein a bias voltage higher than −500 V is applied to the slide-resistant member in an initial stage of depositing the protective film, and a bias voltage of −500 V or lower is applied in a final stage of deposition. A proportion of time duration of the final stage is preferably at most 25% of the total time for depositing the protective film. The method of invention forms a protective film to restrain gas adsorption while preserving durability and corrosion resistance of a p-CVD carbon film, and thus provides a good slide-resistant member or a good wear-resistant member.

Further, the invention provides a magnetic recording medium that exhibits the durability, corrosion resistance, and reduction of gas adsorption simultaneously without increase of a magnetic spacing. A magnetic recording medium of the invention comprises a magnetic recording layer and a protective film that is formed by the method defined above.

A preferred embodiment of the present invention will be described with reference to the accompanying drawings. Although description will be made about an example of magnetic recording medium, a method of forming a protective film of the invention shall not be limited to a magnetic recording medium, but also is applied to forming a p-CVD carbon film for a slide-resistant or wear-resistant member in general.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 2:
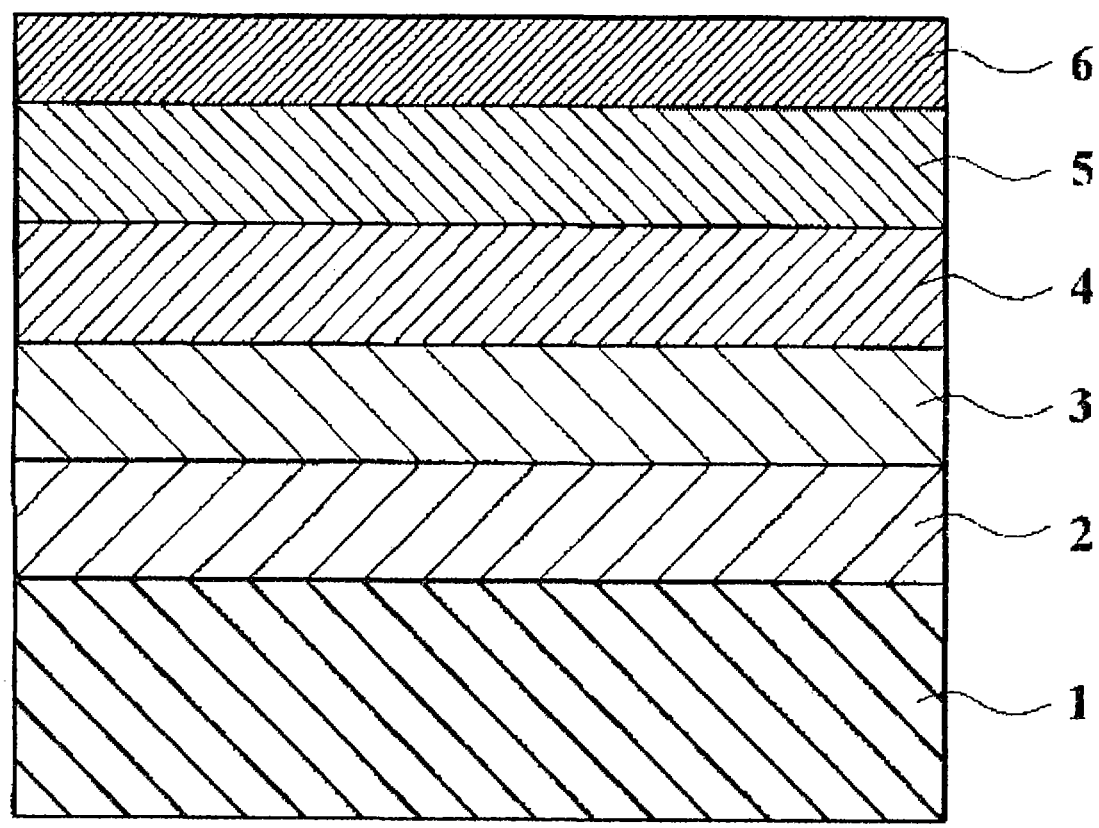
FIG. 2 is a schematic sectional view illustrating an example of a structure of a magnetic recording medium according to the invention.

FIG. 2 illustrates an example of a magnetic recording medium according to the invention, and is a schematic sectional view of an example of a longitudinal magnetic recording medium. The magnetic recording medium comprises substrate 1, and the layers sequentially formed on substrate 1, including underlayer 2, intermediate layer 3, magnetic recording layer 4, and protective film 5. On protective film 5, lubricant layer 6 is formed.

A material of mainly carbon is favorably used for protective film 5, and can be selected from diamond-like carbon (DLC), tetrahedral amorphous carbon (ta-C), amorphous carbon (a-C) and the like. The DLC is preferable because it is dense, hard, and suited for mass production. Nitrogen or hydrogen can be added for the purpose of adjusting the bonding characteristic to the lubricant layer and hardness of the DLC film.

Protective film 5 is formed by a so-called plasma CVD method. A gas used in the deposition process is a mixture of a discharge gas and a raw material gas. The raw material gas is preferably a hydrocarbon gas such as acetylene, ethylene, or methane. When nitrogen or hydrogen is to be added, a gas containing the element is further included. The discharge gas is preferably a rare gas such as argon, krypton, or xenon. The gas in the deposition process is preferably at a pressure of 0.1 Pa to 10 Pa from the viewpoint of stability of discharge and deposition speed. The flow rate of the gas is approximately in the range of 10 sccm to 100 sccm depending on the volume of deposition chamber and the capability of evacuation system.

The plasma is generated for example, by applying a high voltage (about 1,000 V) to a hollow cathode, and a semi-fabricated article having layers up to magnetic recording layer 4 is placed in the plasma to deposit protective film 5. In the stage of forming the outermost layer of the protective film, a negative bias voltage at −500 V or lower (absolute value of the voltage is 500 V or higher) is applied to substrate 1. This process restrains gas adsorption on the protective film.

Figure 1:
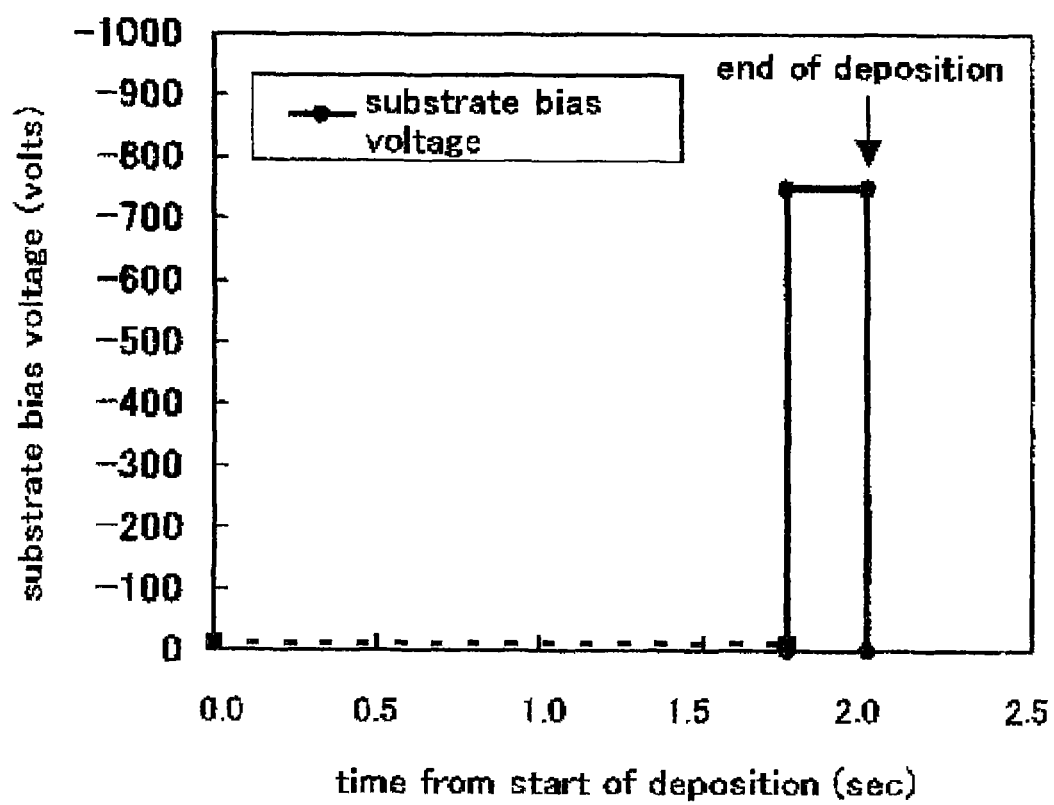
FIG. 1 is a schematic chart illustrating a relation between bias voltage applied to a substrate and elapse of time during a process of forming a protective film.

FIG. 1 is a schematic chart illustrating a relation between bias voltage applied to a substrate and the elapse of time during a process of forming a protective film, in which the dotted line shows a state at a floating potential and the solid line shows a state at a negative bias voltage applied to substrate 1. In this example, the total time of deposition of the protective film is 2.0 seconds. For 1.75 seconds from the start of deposition, the potential of the substrate is a floating potential, and in the duration from 1.75 seconds after the start of deposition to the end of deposition of the protective film, a bias voltage of −750 V is applied to the substrate.

In the earlier stage of deposition, a p-CVD carbon film is deposited at a bias potential on the substrate of higher than −500 V. At this potential, a proper quantity of hydrocarbon radicals is introduced into the p-CVD carbon film. As a result, the film tends to have a rigid three-dimensional tetrahedral structure through the hydrogen. Therefore, a dense and hard film is formed that exhibits excellent durability and corrosion resistance. This effect is more significant when the bias potential is higher than −100 V. In the state of the substrate at a floating potential, a self-bias potential is applied and autonomic bias control works corresponding to the deposition conditions, and the substrate potential can be at an appropriate potential higher than −100 V. Therefore, the floating potential is particularly favorable.

When the outermost layer of the p-CVD carbon film is deposited in the final stage of deposition of a protective film, the substrate bias potential is made −500 V or lower. This process reduces the quantity of hydrogen in the outermost layer and leads to reduced quantity of gas adsorption. A bias voltage higher than −500 V weakens the effect of decreasing the hydrogen. Time duration to apply the bias voltage of −500 V or lower is preferably at most 25% of the total time of protective film deposition. If longer than 25%, the thickness of the dense and hard film decreases, degrading durability and corrosion resistance of the protective film.

In the above description, a bias voltage is applied to the substrate. In the case of an insulator substrate, the bias voltage can be applied to a semi-fabricated article on which a protective film is to be formed. In that case, a bias electrode contacts the magnetic recording layer to apply a bias voltage to the magnetic recording layer.

The plasma can be generated by a commonly used method, including an RF method (13.56 MHz) and a filament method (tungsten) as well as the hollow cathode method.

A thickness of protective film 5 is preferably in the range of 1 nm to 5 nm when used in a magnetic recording medium. A thickness less than 1 nm cannot achieve sufficient reliability of durability and corrosion resistance needed by a magnetic recording device. On the other hand, a thickness more than 5 nm results in too much distance between the outermost surface of magnetic recording layer 4 and a read/write element of a magnetic head to enhance recording density.

Lubricant layer 6 can be formed after forming protective film 5. In addition, a post-treatment such as a tape cleaning treatment can be conducted. Lubricant layer 6 can be formed of a known material, for example, a liquid lubricant of perfluoropolyether. Thickness and other conditions of lubricant layer 6 can be the same as the conditions employed in normal magnetic recording media.

The tape cleaning treatment can be carried out by a method employed in normal magnetic recording media. For example, a tape with abrasive particles is pushed against a rotating magnetic recording medium to move around on the whole surface of the medium. Treatment conditions can be adjusted considering performance of the magnetic recording medium.

Substrate 1 can be composed of a NiP-plated aluminum alloy, chemically strengthened glass, or crystallized glass, which are used in normal magnetic recording media. Underlayer 2 can be composed of a chromium alloy. Several layers of varying compositions can be laminated for the purpose of magnetic alignment, minimization of crystal grain size, and lattice matching. Intermediate layer 3 can be composed of a CoCr alloy or ruthenium to improve thermal stability. Magnetic recording layer 4 can be formed of a CoCrPt alloy. Several layers of varying compositions can be laminated to improve read/write performance.

Some specific examples according to the invention will be described in detail in the following.

Example 1

A magnetic recording medium was produced in the structure illustrated in FIG. 2 except that lubricant layer 6 was not formed.

Substrate 1 was a disk of a NiP-plated aluminum alloy having a diameter of 95 mm and a thickness of 1.27 mm. After cleaning, the substrate was introduced into a sputtering apparatus and CrMo underlayer 2 was deposited using a target of Cr20Mo (in which the numeral omitting a unit symbol represents atomic percent of the element following the numeral, i.e., 20 at % of molybdenum and the balance of chromium. This notation is also valid in the descriptions below.) Subsequently, ruthenium intermediate layer 3 was deposited using a ruthenium target. The sum of the thicknesses of underlayer 2 and intermediate layer 3 was 12 nm. Subsequently, CoCrPtB magnetic recording layer 4 was deposited to a thickness of 18 nm using a target of Co25Cr12Pt3B.

After that, DLC protective film 5 having a thickness of 4.0 nm was formed using a hollow cathode plasma CVD apparatus. The discharge gas was argon at a flow rate of 40 sccm, and the raw material gas was acetylene at a flow rate of 40 sccm. The gas pressure was 0.5 Pa. The discharge current was adjusted so that the film thickness became 4.0 nm after deposition for 2.0 seconds.

Bias voltage applied to the substrate had the scheme as in FIG. 1. The substrate bias voltage was at a floating potential for 1.75 seconds from the start of deposition. The substrate potential was about −10 V in this period. In the period from the time 1.75 seconds to 2.0 seconds, a substrate bias voltage of −750 V was applied, i.e., the time duration of final stage of deposition in which the substrate bias voltage was applied was 0.25 seconds.

The amount of gas adsorption and the amount of specific wear were measured for the magnetic recording media having the protective film formed as described above. The amount of gas adsorption was measured for 3 minutes by detecting $SO_3^-$ ions using a time-of-flight secondary ion mass spectroscopy instrument (TOF-SIMS) after leaving the magnetic recording medium in an atmosphere at a temperature of 23° C., relative humidity of 50%, and $SO_2$ gas concentration of 0.1 ppm for 10 hours. The measurement resulted in about 1,050 counts, which was a low and favorable value.

The amount of specific wear was measured using a ball-on-disk device. Material of the ball was AlTiC, and the ball had a diameter of 2 mm. The load was 5 mN and the rotating speed was 100 rpm. The amount of wear of the DLC protective film was measured after 3 minutes of sliding, using an optical surface inspection apparatus. The measurement resulted in a value of specific wear of $0.6 \times 10^{-7}$ $mm^3/(N\text{-}m)$, which was a small and favorable value.

Experimental Example 1

Magnetic recording media were produced in the same manner as in Example 1 except that the substrate bias voltage and application time of the bias voltage in the final stage of deposition were varied within certain ranges while the total time of forming a DLC protective film 5 was fixed to 2.0 seconds. Studies were done on the effects of substrate bias voltage and application time of the bias voltage in the final stage of deposition using these media.

The resulting amounts of gas adsorption on the magnetic recording media are given in Table 1, and the values of specific wear are given in Table 2. The substrate bias voltage application time in the tables represents time duration from the start of application of a substrate bias voltage to the end of a process of depositing a protective film as illustrated in FIG. 1.

Referring to Table 1, small and favorable amounts of gas adsorption of less than 2,000 counts have been obtained by applying substrate bias voltages of −500 V and lower. Hydrogen hardly enters into the DLC film during its deposition process when a negative substrate bias voltage is applied in the final stage of deposition, and this effect is enhanced by a substrate bias of −500 or lower.

Referring to Table 2, small and favorable values of specific wear of less than $1.0 \times 10^{-7}$ $mm^3/(N\text{-}m)$ have been obtained when the application time of the substrate bias voltage was 0.5 seconds or shorter out of total deposition time of 2.0 seconds. Application of a substrate bias voltage of −500 V or lower gives excessively high energy to the ions falling onto the substrate, which rather unfavorably deteriorates denseness of the film. Accordingly, in the stage of forming a main portion of the protective film, the substrate bias voltage is preferably higher than −500 V, more preferably at a floating potential or −100 V or higher. Time duration of applying a substrate bias voltage of −500 V or lower in the final stage of deposition is preferably 25% or shorter of the total time of film deposition.

TABLE 1

Amount of gas adsorption [counts]

| substrate bias application time | floating potential | −250 V | −500 V | −750 V | −1,000 V |
|---|---|---|---|---|---|
| none | | | 4,300 | | |
| 0.10 sec | — | 3,100 | 1,890 | 1,350 | 1,130 |
| 0.25 sec | 4,300 | 2,900 | 1,480 | 1,050 | 970 |
| 0.50 sec | — | 2,800 | 1,300 | 990 | 910 |
| 1.00 sec | — | — | 1,100 | 920 | 860 |
| 1.50 sec | — | — | — | 920 | — |

TABLE 2

Amount of specific wear [$mm^3/(N\text{-}m)$]

| substrate bias application time | floating potential | −250 V | −500 V | −750 V | −1,000 V |
|---|---|---|---|---|---|
| none | | | $0.5 \times 10^{-7}$ | | |
| 0.10 sec | — | $0.5 \times 10^{-7}$ | $0.5 \times 10^{-7}$ | $0.5 \times 10^{-7}$ | $0.5 \times 10^{-7}$ |
| 0.25 sec | $0.5 \times 10^{-7}$ | $0.5 \times 10^{-7}$ | $0.6 \times 10^{-7}$ | $0.6 \times 10^{-7}$ | $0.7 \times 10^{-7}$ |
| 0.50 sec | — | $0.6 \times 10^{-7}$ | $0.7 \times 10^{-7}$ | $0.8 \times 10^{-7}$ | $0.9 \times 10^{-7}$ |
| 1.00 sec | — | — | $1.1 \times 10^{-7}$ | $1.3 \times 10^{-7}$ | $1.6 \times 10^{-7}$ |
| 1.50 sec | — | — | — | $1.7 \times 10^{-7}$ | — |

Comparative Example 1

In a comparison, substrate bias voltage was applied midway through the process of forming a protective film, and was not applied in the stage of forming the outermost layer of the protective film.

Protective films were deposited with the fixed parameters of total deposition time of 2.0 seconds, substrate bias voltage of −750 V, and time duration for substrate bias application of 0.25 seconds. The bias voltage of the duration of 0.25 seconds was applied at the time from 1.25 seconds to 1.5 seconds or from 0.75 seconds to 1.0 seconds, all these times being from the start of deposition. Other conditions are the same as in Example 1.

The amount of gas adsorption on the thus produced magnetic recording media was measured in the same method as in Example 1, and produced large values in excess of 2,000 counts. Because the gas adsorption depends on the properties of the outermost surface of the DLC film, an effect to restrain gas adsorption cannot be obtained if a negative substrate bias voltage is not applied at the time of depositing the outermost surface region of the DLC film.

Thus, a method of forming a protective film and a magnetic recording medium having a protective film formed by the method have been described according to the present invention. Many modifications and variations may be made to the techniques and structures described and illustrated herein without departing from the spirit and scope of the invention. Accordingly, it should be understood that the methods and media described herein are illustrative only and are not limiting upon the scope of the invention.

What is claimed is:

1. A method of forming a protective film on a magnetic recording medium by means of plasma CVD process using a raw material of hydrocarbon gas, wherein a bias voltage higher than −500 V is applied to the magnetic recording medium in an initial stage of depositing the protective film, and a bias voltage of −500 V or lower is applied in a final stage of deposition.

2. The method of forming a protective film according to claim 1, wherein a proportion of time duration of the final stage of forming the protective film is at most 25% of a total time of the process of forming the protective film.

3. The method of forming a protective film according to claim 1, wherein the bias voltage at the initial stage of deposition floats at a potential or −100 V or higher.

* * * * *